United States Patent
Rombach et al.

(10) Patent No.: US 10,683,201 B2
(45) Date of Patent: Jun. 16, 2020

(54) RESILIENTLY MOUNTED SENSOR SYSTEM WITH DAMPING

(71) Applicant: TDK Corporation, Tokyo (JP)

(72) Inventors: Pirmin Hermann Otto Rombach, Kongens Lyngby (DK); Kurt Rasmussen, Herlev (DK); Anton Leidl, Hohenbrunn (DE); Wolfgang Pahl, München (DE); Dennis Mortensen, Frederiksberg C (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/754,504

(22) PCT Filed: Sep. 30, 2015

(86) PCT No.: PCT/EP2015/072628
§ 371 (c)(1),
(2) Date: Feb. 22, 2018

(87) PCT Pub. No.: WO2017/054868
PCT Pub. Date: Apr. 6, 2017

(65) Prior Publication Data
US 2018/0244515 A1    Aug. 30, 2018

(51) Int. Cl.
*B81B 7/00* (2006.01)
*H01L 23/00* (2006.01)
*B81B 3/00* (2006.01)

(52) U.S. Cl.
CPC .......... *B81B 7/0048* (2013.01); *B81B 3/0018* (2013.01); *H01L 24/34* (2013.01);
(Continued)

(58) Field of Classification Search
CPC ..... B81B 7/0048; B81B 3/0018; H01L 24/34; H01L 2924/00014; H01L 2224/37099;
(Continued)

(56) References Cited

U.S. PATENT DOCUMENTS 6,205,979 B1 *   3/2001  Sims, Jr. ............... F02M 55/04
                                                      123/456
2003/0218283 A1 * 11/2003 Yasumura ............ B81B 3/0078
                                                       267/136
(Continued)

FOREIGN PATENT DOCUMENTS

JP    2004501517 A    1/2004
JP    2008014633 A    1/2008
(Continued)

OTHER PUBLICATIONS

International Search Report and Written Opinion in International Application No. PCT/EP2015/072628, dated Jun. 30, 2016 (10 pages).

*Primary Examiner* — Marcos D. Pizarro
(74) *Attorney, Agent, or Firm* — Nixon Peabody LLP

(57) ABSTRACT

A MEMS device having a sensor system that is resiliently mounted on a carrier by means of spring elements. The air gap between sensor system and carrier is reduced by a damping structure present on one of facing surfaces of sensor system and carrier. The spring elements are at least partially accommodated within recesses of the damping structure. The height of the air gap is small enough to allow squeeze film damping.

16 Claims, 3 Drawing Sheets

(52) U.S. Cl.
CPC ............... *H01L 2224/16225* (2013.01); *H01L 2924/00014* (2013.01); *H01L 2924/1433* (2013.01); *H01L 2924/1461* (2013.01)

(58) Field of Classification Search
CPC .... G01P 15/08; G01P 15/0802; G01P 15/097; G01P 2015/08; G01C 19/578
USPC ........................................................ 257/415
See application file for complete search history.

(56) References Cited

U.S. PATENT DOCUMENTS

| | | | |
|---|---|---|---|
| 2010/0157562 A1 | 6/2010 | Foote | |
| 2011/0298064 A1* | 12/2011 | Pahl .................... | B81B 7/0048 257/415 |
| 2013/0194770 A1 | 8/2013 | Bernstein et al. | |
| 2015/0346232 A1* | 12/2015 | Pruksch ................ | F16F 1/027 73/493 |
| 2017/0089942 A1* | 3/2017 | Chen ................... | G01P 15/0802 |
| 2017/0089943 A1 | 3/2017 | Chen et al. | |

FOREIGN PATENT DOCUMENTS

| | | | |
|---|---|---|---|
| JP | 2012069952 A | 4/2012 | |
| WO | 0198793 A2 | 12/2001 | |

* cited by examiner

RESILIENTLY MOUNTED SENSOR SYSTEM WITH DAMPING

CROSS-REFERENCE TO RELATED APPLICATIONS

This application is a U.S. National Stage of International Application No. PCT/EP2015/072628, filed Sep. 30, 2015, which is incorporated herein by reference in its entirety.

MEMS sensors are micro-structured devices that usually comprise a movable part responsible for the sensing function of the device. Hence, the moveable part is cross sensitive for vibrations or other mechanical impact that may disturb the signal to be sensed or that may have another adverse impact onto the device. Such undesirable influences may be due to stiff packaging of the MEMS sensor and caused by a shock or other vibration.

To avoid damage or impaired reading of a MEMS sensor by mechanical impact the MEMS chip or a sensor system comprising a MEMS chip can be resiliently mounted via a soft glue or via spring elements. These spring elements can additionally function for electrically contacting the MEMS chip while gluing needs bonding wires for electrical connection. Soft silicon based glue might add certain compliance to the damping system but bonding wires still restrict the maximum amplitude that the mass can move to compensate external vibrations. But also the damping properties of such glues are extremely limited and difficult to adjust and their application is quite difficult for small amounts of glue that are necessary in MEMS based devices.

Some MEMS devices are packaged by flip chip bonding and thereby stiffly coupled to the package or carrier. A few MEMS sensor elements are flip chip bonded onto spring elements. The coupling to the package or carrier is compliant, so the mass/spring element system might allow compensating external vibration. But a drawback will be that the system is only marginally damped and resonance might drive the MEMS sensor into saturation.

It is an object of the present invention to provide a MEMS device that shows an improved compensation of external shocks and that is damped to avoid vibrational resonance.

These and other objects are solved by a MEMS device according to the limitations of claim 1. Advantageous embodiments are subject of further claims.

The MEMS device according to the invention comprises a sensor system that is mounted to a carrier via spring elements to absorb mechanical impact like shocks. Here and in the following the term "sensor system" has to be understood as referring to a MEMS chip only or, alternatively, as referring to a stack comprising a MEMS chip and another chip as well. Such other chip may be an ASIC that is part of the MEMS device. The two chips may be fixed and electrically connected to each other that they can be handled like a single chip. Resonance of the resiliently fixed mechanical system of the MEMS device is controlled by reducing the air gap between the two surfaces facing each other. One of these surfaces is the top surface of the carrier and the other surface is the bottom surface of the sensor system. The air gap is reduced by fixing first ends of the spring elements to first anchor points on a first surface of the carrier and second ends of the spring elements to second anchor points on a second surface of the sensor system, wherein first or second ends of the spring elements respectively their anchor points are located on a surface below the top surface of the carrier or above the bottom surface of the sensor system. In other words, the anchor points of first or second ends of the spring elements are mounted in a kind of recess of said top or bottom surfaces. Hence, the height of the air gap corresponding to the distance of bottom and top surface is smaller than the distance between first and second anchor points.

By choosing a sufficient small height of air gap squeeze film damping is achieved. Damping occurs due to the squeezing air film in the gap thereby adsorbing energy when the air film streams out of the gap or inside the gap. Preferably a maximum damping is targeted by optimizing the air gap. Damping should be set to be greater or equal to a minimum value. But the minimum air gap has to take into account that still a certain amplitude for compression of spring elements is necessary that the mass can sufficiently move to compensate external vibration.

A preferred measure for reducing the gap is to apply a damping structure to at least one surface chosen from a first surface located on the carrier and a second surface located on the sensor system wherein the first surface comprises the first anchor point and the second surface comprises the second anchor point. Hence the height of the air gap that would be the distance between the anchor points if no damping structure were present is reduced by the height of thickness of the damping structure.

By accurately forming the damping layer and controlling the thickness thereof the amount of squeeze film damping that depends on the height of the air gap can be set.

To allow extension or compression of the spring elements the spring elements are arranged in recesses of the damping structure. The measure of the recesses is chosen to fully accommodate the spring elements laterally and to not hinder the spring movement directly.

Preferably the spring elements are connected towards the sensor system via respective connection elements selected from solder bumps, stud bumps and adhesive. The total height of the spring elements and their connection elements is higher than the height of the damping layer respectively the damping structure.

The spring elements can be flat springs that are fixed with one of their ends to an electrical contact on the first surface of the carrier. The other end is free standing in a distance to the first surface. To this free standing end the sensor system is mounted with a second electrical contact on its second surface at the bottom. An angled or curved course of a spring element provides a reserve for compensation of different thermal expansions of the spring element, sensor system and carrier without producing too much forces at its ends.

The spring elements can alternatively be formed angled with two or more angles. They can be bent or formed as spirals.

Advantageously the spring elements are thin metal structures that can have dimensions of thickened conductor lines. To guaranty sufficient mechanical strength the number of spring elements can be chosen sufficiently high to extend the number of electrically required connections. The MEMS device can thus comprise a plurality of spring elements that are electrically circuited in parallel to provide a lower number of electrical connections.

A regular distribution of anchor points over the whole surface of the sensor system allows compensating forces that affect the MEMS device from different sides.

The first electrical contacts on the carrier can be formed as flat metallizations. But it is possible too to use the through contacts having respectively their orifice at the first surface of the carrier. The spring elements may be bonded to the carrier by solder or a bump.

Alternatively the spring elements may be formed directly on the surface of the carrier by an additive process using a lithography and galvanic deposition of a metal that is typically grown on a starting layer deposited by a PVD process.

Especially for such a spring element, complex manufacturing steps are required as a sacrificial material needs to be arranged between the top side of the carrier and the later position of the free-standing end. After depositing the metal of the spring element on the sacrificial material, the respective sacrificial material needs to be removed such that the free-standing end of the spring element can move in all directions.

Thus, a polymer was found to be the optimal material for a sacrificial material.

Typical materials contained in the spring elements are Cu, Ni, Al or the like. Further, it is possible that the spring element consists of a metal like Cu, Ni, or Al. Typical dimensions are 5-100 µm in thickness, 10-100 µm in width, and 100-2000 µm in length. The spring constant for the assembly comprising the sensor system that is soldered onto typically 3-30 spring elements is in the range of 10 N/m-10 kN/m in z-axis. Same is true if more spring elements are present. Spring constants in x- and y-axis can be similar, but depending on the specific application it can be advantageous to have a strong anisotropic behavior, i.e. to set the spring constants in x- and y-axis higher by a factor of 2-50.

The material of the damping structure can be chosen arbitrarily as this material has nearly no influence on squeeze film damping. Hence, the material comprises a metal, a polymer, a ceramic, an ink or any other layer that can be deposited in a controlled manner.

It is possible to apply a layer for the damping structure onto the entire surface and to perform at least a step of structuring the layer after deposition. Alternatively the damping structure can be applied structured and thus can be applied in an area according to a desired structure.

The damping structure can be applied in a simple lamination process of a photosensitive layer and a subsequent structuring by image wise treatment with an appropriate radiation and subsequent removal of those parts that have a better solubility or are prone to removal after treatment. The remaining structure can be used as damping structure. But it is possible too that the remaining structure can be used as mask for forming the damping structure out of another material. It is possible to grow a metallic structure in the recesses of the structured photosensitive layer. Copper and nickel are preferred materials for electro or currentless plating.

Applying a polymer and structuring with partial laser ablation is another possible manufacturing process for the damping structure.

Any kind of printing like screen printing, stencil printing jet printing or 3D printing is possible too.

Metallic films can be laminated on or plated. Wet etching can be used to structure the metallic film.

According to an embodiment the damping structure comprises one or more air channels to provide further damping by the damping structure. Inside an air channel further friction occurs that absorbs energy out of the system.

An air channel extends laterally and can have an orifice at an outer edge of the damping structure. The air channel can extend linearly. But if bent or angled more energy can be absorbed when air is squeeze through the air channel. Preferable each air channel communicates with a recess and broadens to accommodate the spring element.

In an embodiment the spring elements and the damping structure comprise the same material. This way the same manufacturing steps could be used for forming the damping layer and for forming the spring elements.

Within the carrier at least a buried metallization is provided and structured to form a circuiting layer. Through contacts make connections to first electrical contacts or vias on the first surface and to terminal contacts on the bottom side of the carrier. Hence the carrier substrate may be a multi-layer substrate comprising a metallization layer between two dielectric layers.

In the metallization layer, signal conductors or circuit elements such as resistive elements, capacitive elements or inductive elements or phase shifters or similar circuit elements can be structured.

Accordingly, it is possible that the MEMS device comprises such an additional circuit element embedded in the multi-layer substrate. It is further possible that an additional circuit element is an active circuit element that may interact with an ASIC that is part of the MEMS device and mounted on top of the carrier.

Inductive elements can be realized by coil shaped conductor stripes within the same metallization layer. Capacitive elements can comprise electrodes existing in different metallization layers stacked one above the other.

Vias can be utilized to electrically connect different circuit elements in different metallization layers and/or first electrical contacts on the top side of the carrier and third electrical contacts for externally contacting the MEMS device at the bottom side of the carrier.

In an embodiment, a stack of two chips is mounted onto the spring elements instead of a single MEMS chip. This can be a MEMS-on-ASIC or an ASIC-on-MEMS configuration. Direct connections between both chips can be used as well as for example bond wires. The lower chip facing the carrier in the MEMS device can have vias allowing to connect the upper chip directly to the springs and thus to the carrier by these vias.

A proposed method for manufacturing the MEMS device comprises the steps a) to e)
  a) Providing a carrier having a first surface and first electrical contacts thereon
  b) Providing a sensor system having a second surface and second electrical contacts thereon
  c) Forming a damping layer by applying and structuring the damping layer on one of first and second surface such that recesses are formed
  d) Forming spring elements on the first electrical contacts of the first surface such that a free standing end of the spring element forms a gap between free standing end and first surface
  e) Coupling the MEMS chip via the second electrical contacts onto the free standing ends of the spring elements by means of bumps such that the spring elements are accommodated within the recesses partially or completely in their resting position that is without extension therefrom.

In step c) applying and structuring of the damping layer can comprise galvanic forming of a structured damping layer of a metal.

Alternatively applying and structuring the damping layer can comprise printing the damping layer onto said surface.

It is preferred to use a similar or the same step for manufacturing the damping structure and for manufacturing the spring element. For example a metallic spring element and a metallic damping structure can use the same process. Alternatively a polymer mask for growing a metallic damping structure can at the same time be used as a sacrificial layer to produce the free standing end of the spring element.

To reduce production tolerance a trimming process can follow the forming of the damping structure to set the height of the damping structure and thus the height of the air gap to an exact value. For trimming purpose precision grinding can be used.

Further it is possible to use a preformed MID part (MID=molded interconnect device). Such a MID part may be typically an injection molded 3D structured polymer part with 3D conductors, solder pads and terminals on its surfaces. According to an alternative method for manufacturing the MEMS device the steps are done:
A) Providing a carrier having a first surface and first electrical contacts thereon
B) Providing a sensor system having a second surface and second electrical contacts thereon
C) Forming a structured damping layer by an ablative method.

The ablative method can comprise structuring a first surface of the carrier or a second surface of the sensor system instead of applying material for the damping structure. Thereby milling, stamping, etching, laser ablation can be used to etch recesses and air channels into the surface of carrier or sensor system.

The ablative method can alternatively comprise applying a polymer layer to the entire surface of the first or second surface and structuring same by photolithography and subsequent development, or by a partial laser ablation of material from the entirely applied polymer layer, or by a photolithography, etching or laser ablation of a polymer film before applying the polymer film to the first surface of the carrier.

In the following the invention will be explained in more detail with reference to the accompanied figures. The figures are schematic only and not drawn to scale. The same details or details that work in a similar manner are referenced by the same reference symbol.

Figure 1:
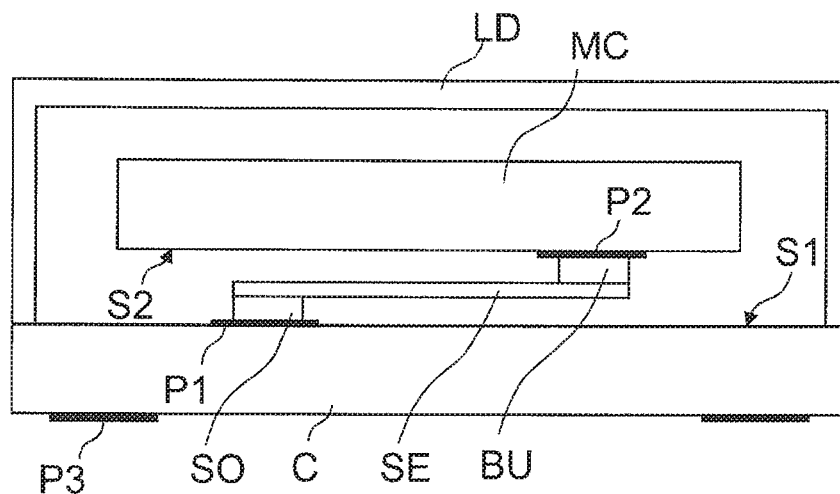
FIG. 1 shows a cross section of known MEMS device wherein the sensor system is resiliently mounted to a carrier via spring elements

FIG. 1 shows a cross section through a MEMS device. The device comprises a sensor system MC that may be sensor like a pressure sensor or a microphone. The sensor system MC is resiliently mounted onto a carrier C via spring elements SE. The spring elements SE may comprise a stand-off SO on the carrier and a free standing end laterally extending therefrom. The sensor system MC is bonded to the free standing end by means of bumps BU. Via the spring element SE, stand-off SO and bump BU electrical contact between second electrical contacts P2 on the bottom surface of the sensor system MC and first electrical contacts P1 on the carrier C is achieved.

The carrier C may be a multilayer printed circuited board that may have a multilayer structure comprising at least one wiring layer and other internal wiring connecting the first electrical contacts P1 to external contacts P3 of the MEMS device on the bottom surface of the carrier.

A lid LD is bonded to the top surface of the carrier C via a glue or solder. Between lid LD and carrier C a volume is enclosed accommodating at least the sensor system. The volume may be necessary for the function of the MEMS device and may provide protection against chemical and mechanical impact from the environment. An opening (not shown) may allow communication for sensing an environmental parameter. For clarity reasons only the sensor system MC comprising the MEMS chip is shown. But other components of the MEMS device like an ASIC for example may be accommodated too under the lid LD.

An ASIC may be stacked with the MEMS chip and form the upper or the lower part of the stack. For simplicity reason here and in the following description it is only referred to a sensor system even when a stack of a MEMS chip and another component is present and meant. Such a stack can have bottom surface with second electrical contacts for contacting the MEMS chip and the further component as well. It is possible too that the second electrical contacts only comprise terminals of the AISC while the MEMS chip is contacted to further electrical contacts arranged on the top side of the ASIC.

Figure 2:
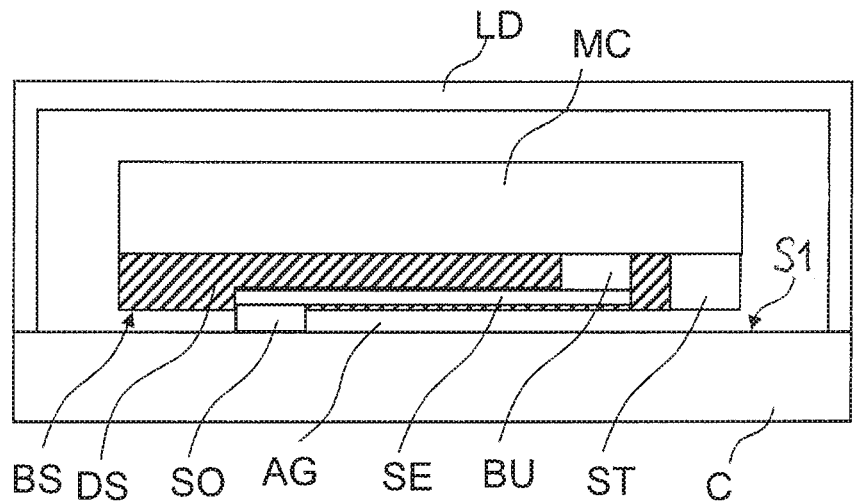
FIG. 2 shows a cross section of a MEMS device according to a first embodiment of the invention wherein an air gap between sensor system and carrier is reduced by a damping structure on the sensor system.

But an external shock may be able to induce a resonance of the whole arrangement due to the resilient spring elements that are not damped. This resonance may saturate the MEMS chip and disturb its sensing function. FIG. 2 shows a cross section of a MEMS device according to a first embodiment of the invention. Further to the features already mentioned with reference to FIG. 1 a damping structure DS is applied to a second surface on the bottom of the sensor system MC. The damping structure DS comprises recesses to accommodate the spring elements SE. Thereby the airgap AG between the bottom surface BS of the sensor system and the surface S1 of the carrier is reduced. As the spring elements SE are mounted to an anchor point on the second surface S2 of the sensor system "below" the damping structure the maximum mutual movement of sensor system versus carrier is limited by the air gap AG between surface S1 of carrier C and bottom surface BS of sensor system with damping layer. The air gap AG is reduced with regard to the device of FIG. 1. The height of the air gap AG is set to value small enough that squeeze film damping occurs. Preferably a maximum damping is desired requiring a minimum height of the air gap AG. But a trade-off with the stress releasing movement of spring elements has to be made that the height of the air gap corresponds to the required spring reflection. A distance element ST is voluntary but not necessary as the damping structure may function similarly. For the reason of clarity other features of the MEMS device are not shown.

Typical dimensions of an inventive MEMS device can be chosen as follows:

| | |
|---|---|
| Height of gap between first and second surface that is before forming of the damping structure: | 10-200 μm |
| Height of air gap AG (after forming the damping structure): | 5-50 μm |
| Width of air channel: | 3-50 μm |

| | |
|---|---|
| Length of spring element independent whether linear, angled or curved: | 200-2000 μm |
| Width of spring element: | 20-100 μm |
| Thickness of spring element: | 5-50 μm |

Figure 3:
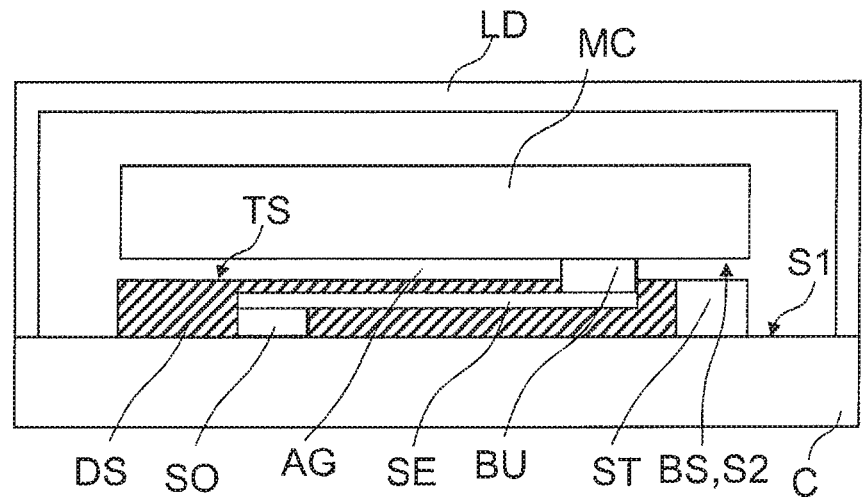
FIG. 3 shows a cross section of MEMS device according to a second embodiment of the invention wherein an air gap between sensor system and carrier is reduced by an damping structure on the carrier.

FIG. 3 shows a cross section of a MEMS device according to a second embodiment of the invention. Different from the first embodiment of FIG. 2 the damping structure DS is applied to a first surface on top of the carrier C. The thus reduced air gap AG is formed between the top surface TS on the damping structure DS and the bottom surface BS of the sensor system MC which is in this embodiment identical to the second surface S2. The same effect is achieved by this embodiment as the same squeeze film damping occurs at this air gap AG.

Figure 4:
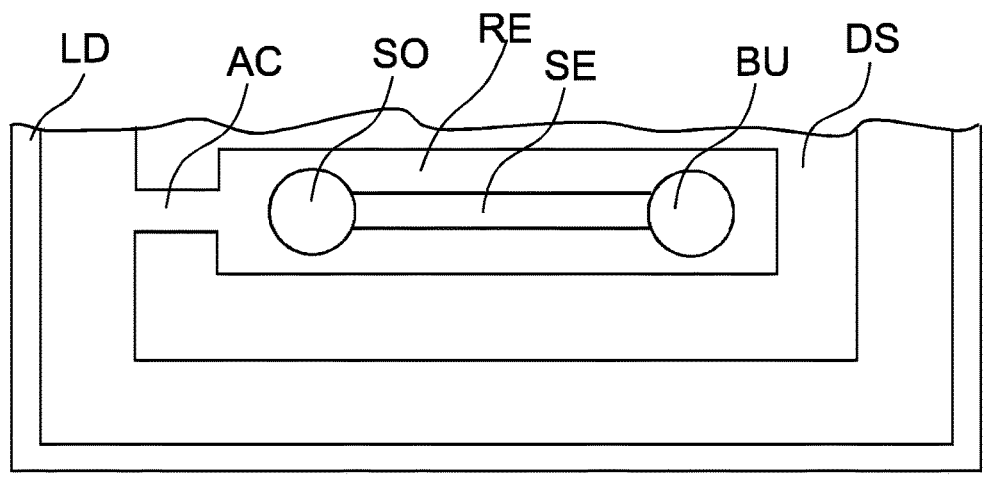
FIG. 4 shows a cross sectional top view MEMS device according to an embodiment with a spring element accommodated in a recess of the damping structure.

FIG. 4 shows a cross sectional top view onto the MEMS device according to the first or second embodiment. This figure depicts a possible shape of the recesses RE within the damping structure DS. At least the recess has to accommodate the spring element to guarantee an unhindered movement thereof including stand-off SO and bump BU. It is preferred that the recess follows the shape of the spring element in a small distance to make the recess as small as possible but as great as required. Due to an easier manufacturing simple geometrical shapes like rectangles can be preferred. But in general any arbitrary lateral shape is possible. FIG. 4 shows a cross section that keeps nearly constant over the total height of the damping structure DS as vertical sidewalls of the recess are preferred. If the step of forming the recess produces inclined side walls this would not negatively influence the damping effect and so deviating from vertical sidewall is allowed and possible.

Figure 5:
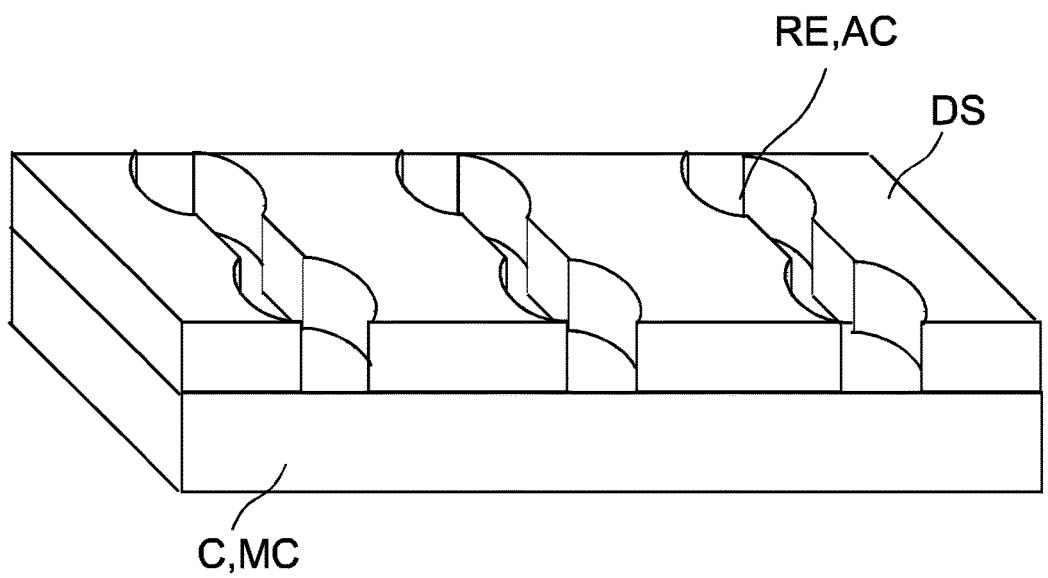
FIG. 5 shows a damping structure having another outline and comprising an air channel.

In the embodiment of FIG. 4 an air channel AC is shown that is open at an outer lateral edge of the damping structure. The air channel may comprise the recess RE and functions to let circulate air therein when the air gap AG is enhanced or reduced due to compression or extension of the spring elements. Other air channels may open at outer edges e.g. at opposite sides of the damping structure as shown in FIG. 5 for example. Further air channels may be formed independent from the recess and do not accommodate a spring element.

The number of recesses RE and spring elements SE may be chosen according to the number of independent electrical terminals of the sensor system MC. But it may be advantageous to use a larger number of spring elements and most preferably as many spring elements as possible, that means as many as can be arranged on without problems on the limited bottom surface of the sensor system.

FIG. 5 shows another exemplary shape of the recesses RE in a damping structure DS that may be applied onto the first surface S1 of the carrier C or the second surface S2 on the bottom the sensor system MC. This shape follows the shape of the spring elements shown in FIG. 4. The outer boundary of the damping structure DS may correspond to the second surface S2 respectively to the edges thereof. But the damping structure may alternatively extend the outer edges of the sensor system MC and may have a larger lateral extension. A lower extension is possible too. Between damping structure and outer edge of the carrier a circumferential margin is kept to place the lid on this margin.

Figure 6:
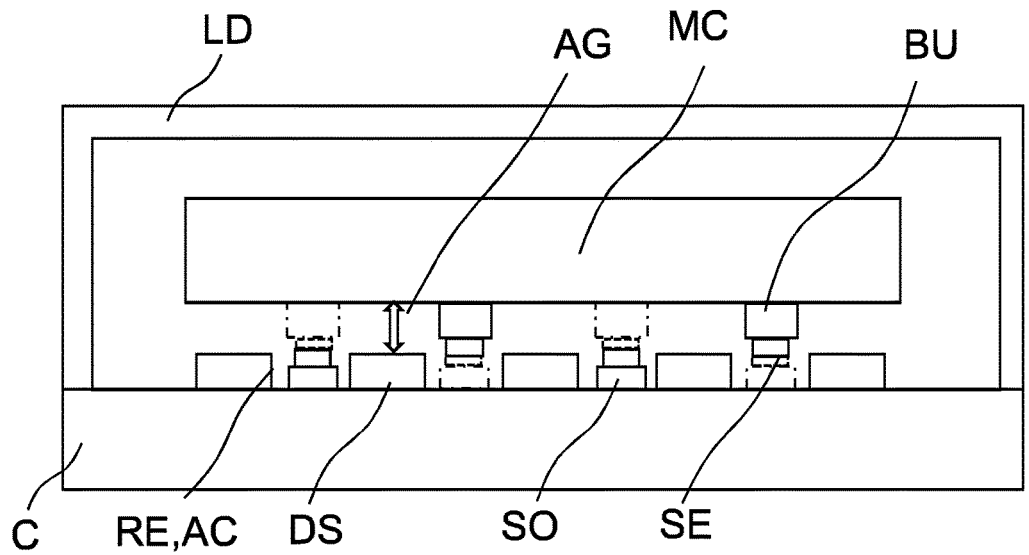
FIG. 6 shows another cross section of MEMS device according to the second embodiment.

FIG. 6 shows another cross sectional side view of a MEMS device according to the second embodiment of FIG. 3. In this figure the recesses and the spring elements as well are cut normal to their longitudinal extension. In this figure the spring elements are arranged in parallel to each other and are alternatingly attached near opposite edges of the sensor system or the projection of the sensor system on the first surface. The dashed lines depict a structure behind the paper plane while the solid lines depict a structure within the paper plane.

Figure 7:
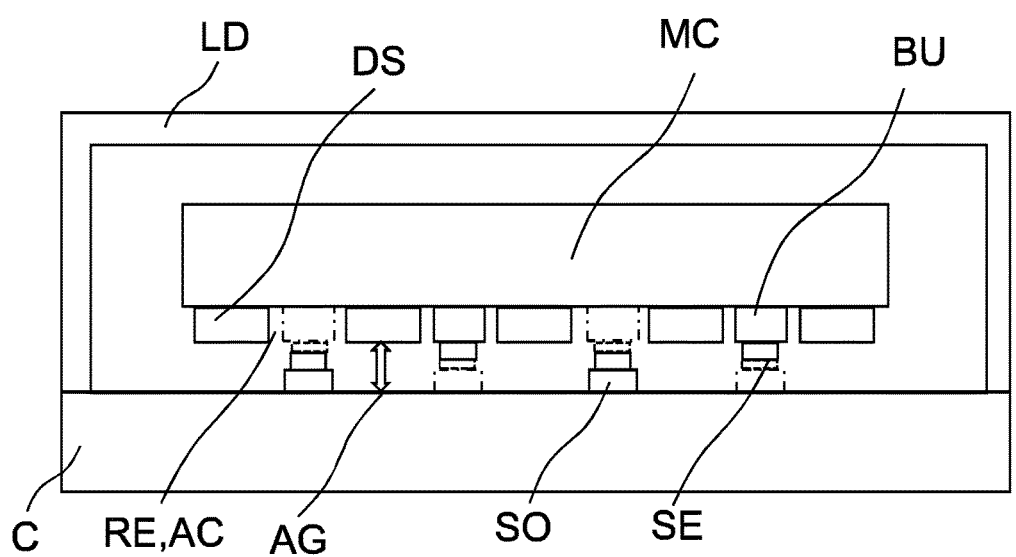
FIG. 7 shows another cross section of MEMS device according to the first embodiment.

FIG. 7 shows a similar cross sectional side view of a MEMS device where in contrast to FIG. 6 the damping structure is applied to the second surface at the bottom of the sensor system. In this case the lateral extension of the damping structure is limited by the edges of the sensor system.

Figure 8:
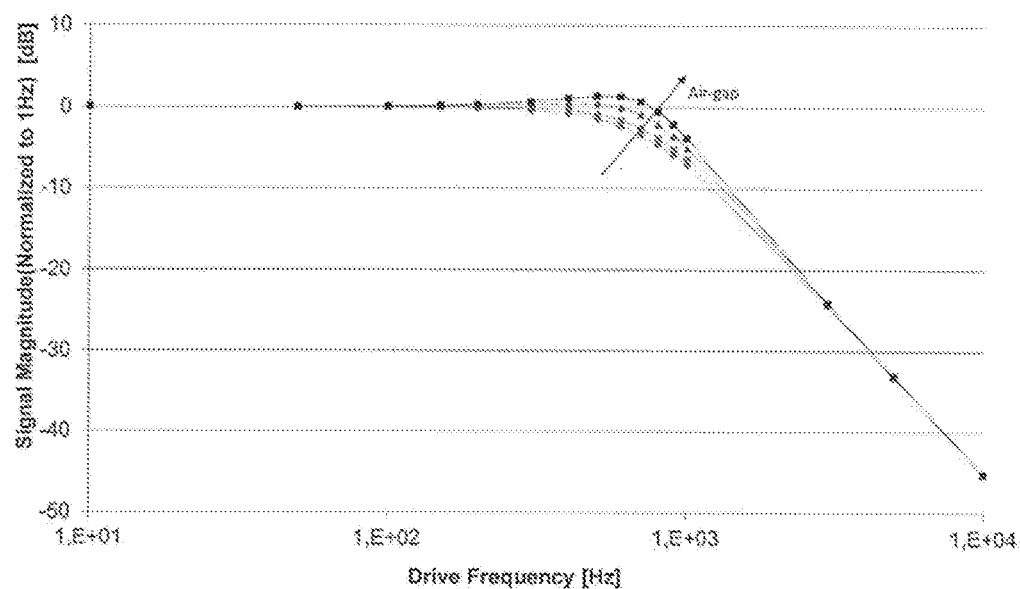
FIG. 8 shows the frequency response for the attenuation of external vibrations for different heights of the air gap.

FIG. 8 shows the frequency response for the attenuation of external vibrations. Different graphs constitute the resonance behavior for different heights of the air gap. The graphs are coincident over a major range of frequencies but are spreading near the mechanical resonance frequency of the MEMS device due to the resilient spring elements. The air gap inclines in direction of the depicted arrow. This means that an air gap having a minimum height produces the lowest resonance rise respectively the highest damping. This complies with expectation known from other systems using squeeze film damping.

The invention has been explained with reference to a restricted number of embodiment and can thus, not be limited to the shown embodiments. Any variation of single features within the scope of the claims will be regarded to be part of the invention. Further, any new combination of single features that are disclosed in connection with other features only are comprised by the invention.

LIST OF REFERENCE SYMBOLS AND TECHNICAL TERMS

| | |
|---|---|
| MC | sensor system |
| SE | Spring element |
| C | Carrier |
| AG | Air gap |
| BU | Bump |
| DS | Damping structure |
| AC | Air channel |
| TS | Top surface of carrier (for gap measure) |
| BS | Bottom surface of sensor system (for gap measure) |
| S1 | First surface on carrier (when damping structure is applied on this surface) |
| S2 | second surface on sensor system (when damping structure is applied on this surface) |
| SO | Stand-off |
| RE | Recess in layer forming damping structure |
| AC | Air channel, further structure in damping structure |
| ST | Distance element |
| LD | lid |

The invention claimed is:

1. A MEMS device, wherein
a sensor system is resiliently mounted on a carrier by means of spring elements,
the spring elements are metallic and comprise an elongated structure that is linear, bent or angled,
a first end of the extended structure is coupled to a first anchor point on the carrier,
a second end of the extended structure is coupled to a second anchor point on the sensor system,
an air gap is provided between a top surface of the carrier and a bottom surface of the sensor system,
a height of the air gap normal to the top or bottom surface is smaller than a distance normal to the top or bottom surface between first and second anchor point, and the height of the air gap is small enough that a damping of a movement of the sensor system towards the carrier is enabled, the height being greater than or equal to a minimum value by squeeze film damping due to air in the air gap, wherein a damping structure is applied to at least one surface chosen from a first surface located on the carrier and a second surface located on the sensor system, wherein first surface comprises the first anchor point and the second surface includes the second anchor point, wherein the damping structure is applied as a layer between the sensor system and the carrier on the first surface or on the second surface, the height of the air gap being reduced by inserting the layer into the air gap, wherein the layer forms a damping structure and is applied to the first or the second surface, and the layer includes recesses to accommodate the spring elements.

2. The MEMS device according to claim 1, wherein the height of the air gap is small enough that a damping is enabled greater or equal to a minimum value by squeeze film damping due to air in the air gap.

3. The MEMS device according to claim 1, wherein the damping structure comprises a metal, a polymer, a ceramic, an ink or any other layer that can be deposited in a controlled manner and that can be applied in an area according to a desired structure or that can be structured after deposition of the layer.

4. The MEMS device according to claim 1, wherein the damping structure comprises an air channel to provide further damping by the damping structure.

5. The MEMS device according to claim 4, wherein the air channel extends laterally and opens at an outer edge of the damping structure.

6. The MEMS device according to claim 4, wherein the air channel broadens to accommodate a spring element.

7. The MEMS device according to claim 1, wherein the spring elements and the damping structure comprise the same material.

8. A MEMS device, wherein a sensor system is resiliently mounted on a carrier by means of spring elements, the spring elements are metallic and comprise an elongated structure that is linear, bent or angled, a first end of the extended structure is coupled to a first anchor point on the carrier, a second end of the extended structure is coupled to a second anchor point on the sensor system, an air gap is provided between a top surface of the carrier and a bottom surface of the sensor system, a height of the air gap normal to the top or bottom surface is smaller than a distance normal to the top or bottom surface between first and second anchor point, wherein a damping structure is applied to at least one surface chosen from a first surface located on the carrier and a second surface located on the sensor system, wherein first surface comprises the first anchor point and the second surface comprises the second anchor point, wherein the damping structure is applied as a layer between the sensor system and the carrier on the first surface or the second surface, the height of the air gap being reduced by inserting the layer into the air gap, wherein the layer comprises recesses, and wherein the recesses are at least measured to accommodate the spring elements.

9. The MEMS device according to claim 8, wherein the height of the air gap is small enough that a damping is enabled greater or equal to a minimum value by squeeze film damping due to air in the air gap.

10. The MEMS device according to claim 8, wherein the damping structure comprises a metal, a polymer, a ceramic, an ink or any other layer that can be deposited in a controlled manner and that can be applied in an area according to a desired structure or that can be structured after deposition of the layer.

11. The MEMS device according to claim 8, wherein the spring elements and the damping structure comprise the same material.

12. A MEMS device, wherein a sensor system is resiliently mounted on a carrier by means of spring elements, the spring elements are metallic and comprise an elongated structure that is linear, bent or angled, a first end of the extended structure is coupled to a first anchor point on the carrier, a second end of the extended structure is coupled to a second anchor point on the sensor system, an air gap is provided between a top surface of the carrier and a bottom surface of the sensor system, a height of the air gap normal to the top or bottom surface is smaller than a distance normal to the top or bottom surface between first and second anchor point, wherein a damping structure is applied to at least one surface chosen from a first surface located on the carrier and a second surface located on the sensor system, wherein first surface comprises the first anchor point and the second surface comprises the second anchor point, and wherein the damping structure comprises an air channel to provide further damping by the damping structure wherein the damping structure comprises a metal, a polymer, a ceramic, an ink or any other layer that can be deposited in a controlled manner and that can be applied in an area according to a desired structure or that can be structured after deposition of the layer.

13. The MEMS device according to claim 12, wherein the air channels broaden to accommodate a spring element each.

14. The MEMS device according to claim 12, wherein the spring elements and the damping structure comprise the same material.

15. The MEMS device according to claim 12, wherein the damping structure comprises a metal, a polymer, a ceramic, an ink or any other layer that can be deposited in a controlled manner and that can be applied in an area according to a desired structure or that can be structured after deposition of the layer.

16. The MEMS device according to claim 12, wherein the air channel extends laterally and opens at an outer edge of the damping structure.

* * * * *